US008664935B2

(12) United States Patent
Shaw et al.

(10) Patent No.: US 8,664,935 B2
(45) Date of Patent: Mar. 4, 2014

(54) MAGNETIC SHIELD FOR CURRENT TRANSFORMER IN ELECTRONIC WATT-HOUR METER

(75) Inventors: Bradley Douglas Shaw, Plaistow, NH (US); Dwight Wayne Ingram, Mauldin, SC (US)

(73) Assignee: General Electric Company, Schenectady, NY (US)

( * ) Notice: Subject to any disclaimer, the term of this patent is extended or adjusted under 35 U.S.C. 154(b) by 613 days.

(21) Appl. No.: 12/953,713

(22) Filed: Nov. 24, 2010

(65) Prior Publication Data

US 2012/0126787 A1 May 24, 2012

(51) Int. Cl.
*G01R 1/00* (2006.01)
*G01R 19/00* (2006.01)

(52) U.S. Cl.
USPC ..................... 324/110; 324/76.11; 324/117 R

(58) Field of Classification Search
None
See application file for complete search history.

(56) References Cited

U.S. PATENT DOCUMENTS

| | | | | |
|---|---|---|---|---|
| 3,366,907 | A | 10/1965 | Tipton | |
| 4,030,057 | A | 6/1977 | Kohler et al. | |
| 4,295,112 | A | 10/1981 | Yamada et al. | |
| 4,760,333 | A | 7/1988 | Ichimura et al. | |
| 5,079,462 | A | 1/1992 | Shah et al. | |
| 5,486,755 | A | 1/1996 | Horan et al. | |
| 5,828,282 | A | 10/1998 | Tiemann | |
| 5,853,300 | A * | 12/1998 | Robinson et al. | 439/517 |
| 5,926,014 | A | 7/1999 | Tiemann | |
| 6,239,588 | B1 | 5/2001 | Tiemann | |
| 6,605,937 | B2 | 8/2003 | Germer et al. | |
| 6,788,046 | B2 * | 9/2004 | Lenhard et al. | 324/117 R |
| 7,265,532 | B2 | 9/2007 | Karanam et al. | |
| 8,179,122 | B2 * | 5/2012 | Ibuki | 324/127 |
| 2005/0139289 | A1 | 6/2005 | Chiba et al. | |
| 2010/0081483 | A1 | 4/2010 | Chatterjee et al. | |
| 2011/0133561 | A1 * | 6/2011 | Kanazawa et al. | 307/75 |

FOREIGN PATENT DOCUMENTS

| | | | |
|---|---|---|---|
| DE | 202004000642 | U1 | 3/2004 |
| EP | 0196511 | A1 | 10/1986 |
| EP | 0556099 | A1 | 8/1993 |
| GB | 542861 | A | 1/1942 |
| GB | 846362 | A | 8/1960 |
| JP | H06302451 | A | 10/1994 |

OTHER PUBLICATIONS

European Patent Office, European Search Report for Application No. 11189418.4 dated Mar. 27, 2012, 9 pages.

* cited by examiner

*Primary Examiner* — Jermele M Hollington
*Assistant Examiner* — Trung Nguyen
(74) *Attorney, Agent, or Firm* — Hoffman Warnick LLC; William Heinze

(57) ABSTRACT

An electronic watt-hour meter; a current transformer operatively coupled to the electronic watt-hour meter; a first shield on a first side of the current transformer; and a second shield on a second side of the current transformer, wherein the second side is substantially parallel to the first side, wherein the first shield and the second shield each include a substantially magnetically permeable and conductive metal.

7 Claims, 12 Drawing Sheets

MAGNETIC SHIELD FOR CURRENT TRANSFORMER IN ELECTRONIC WATT-HOUR METER

BACKGROUND OF THE INVENTION

This invention relates generally to electronic watt-hour meters and more particularly to a shield for a current transformer in an electronic watt-hour meter.

Referring to FIG. 1, a top view, and FIG. 2, a perspective view, of a known electronic watt-hour meter 102 are shown. Electronic watt-hour meter 102 is used to measure usage of electricity. Electronic watt-hour meter 102 may include a meter base 103 and at least one current transformer 104 with a potential link 106 running through each current transformer 104. Other components included in electronic watt-hour meter 102 may include, for example, a surge suppressor 105, a current transformer cable 107, and metrology circuitry bracket 109. A current is measured by a metrology circuitry (not shown) in electronic watt-hour meter 102 and used in the calculation of energy usage.

Referring to FIG. 3, a perspective view, of a known current transformer 104 and known potential link 106 are shown. A potential link current flow 122 (shown by arrow) through potential link 106 may produce a current transformer magnetic field 116 in current transformer 104. Current transformer magnetic field 116 may moves circularly through a ferrite core (not shown) of current transformer. Current transformer magnetic field 116 may cause a current transformer current flow 117 in current transformer 104 directly proportional to the number of windings 119 in current transformer 104 and potential link current flow 122.

Referring to FIG. 4, a simplified top view of electronic watt-hour meter 102 is shown for illustrative purpose. If an external magnet 108 is placed in proximity to current transformer 104, then current transformer 104 is affected by an external magnet magnetic field 115 from external magnet 108. External magnet 108 may saturate a current transformer 104, thereby reducing its ability to accurately induce a proportional current in the windings (not shown) of current transformer 104. This reduction in performance results in a lower value of current flowing in the current transformer 104 and an incorrect electricity usage calculation. Use of an external magnet 108 for this purpose may result in theft of electricity. Shielding of the current transformer 104 may result in reducing the effect of the external magnet 108 on the current transformer 104.

SUMMARY OF THE INVENTION

A first aspect of the invention includes an electronic watt-hour meter, comprising: a current transformer operatively coupled to the electronic watt-hour meter; a first shield on a first side of the current transformer; and a second shield on a second side of the current transformer, wherein the second side is substantially parallel to the first side, wherein the first shield and the second shield each include a substantially magnetically permeable and conductive metal.

A second aspect of the invention includes an electronic watt-hour meter, comprising: a current transformer operatively coupled to the electronic watt-hour meter; a first shield on a first side of the current transformer; a second shield on a second side of the current transformer, wherein the second side is substantially parallel to the first side; wherein at least one of the first shield and the second shield substantially shields up to approximately 5000 gauss from an external magnet.

A third aspect of the invention includes a first magnetic shield for a current transformer, comprising; a substantially disc shape body; an aperture through approximately a center of the body; and a gap in the body, the gap extending from an edge of the body to the aperture, wherein the body includes a substantially magnetically permeable and conductive metal.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

Figure 2:
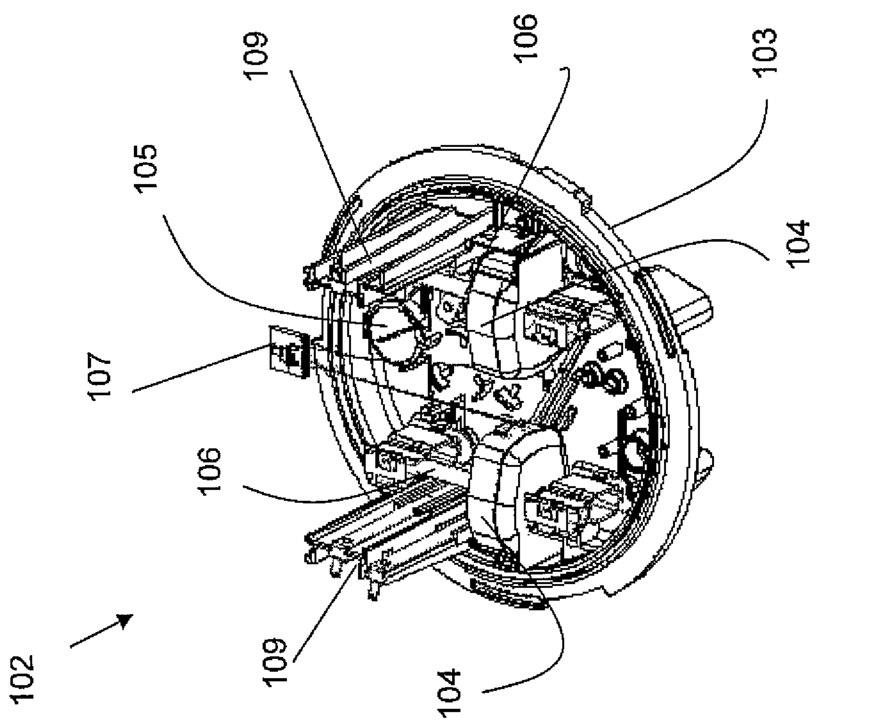
FIG. 2 PRIOR ART
FIG. 2 shows a perspective view of a known electronic watt-hour meter.
Figure 1:
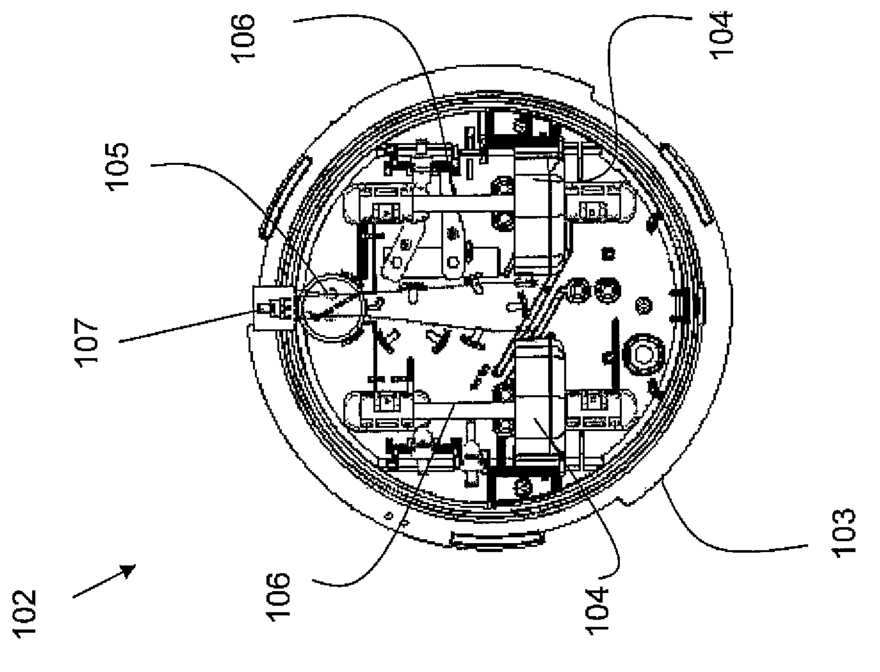
FIG. 1 PRIOR ART
FIG. 1 shows a top view of a known electronic watt-hour meter.
Figure 3:
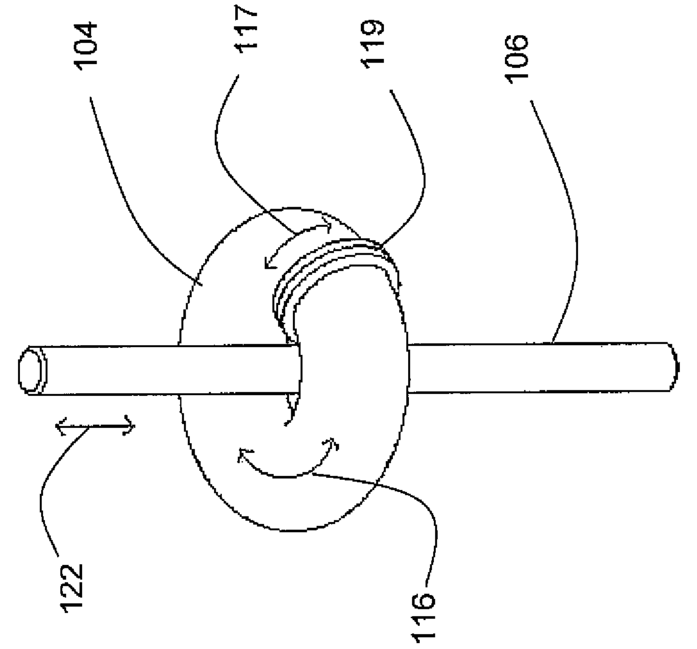
FIG. 3 PRIOR ART
FIG. 3 shows a perspective view of a known current transformer and a known potential link.
Figure 4:
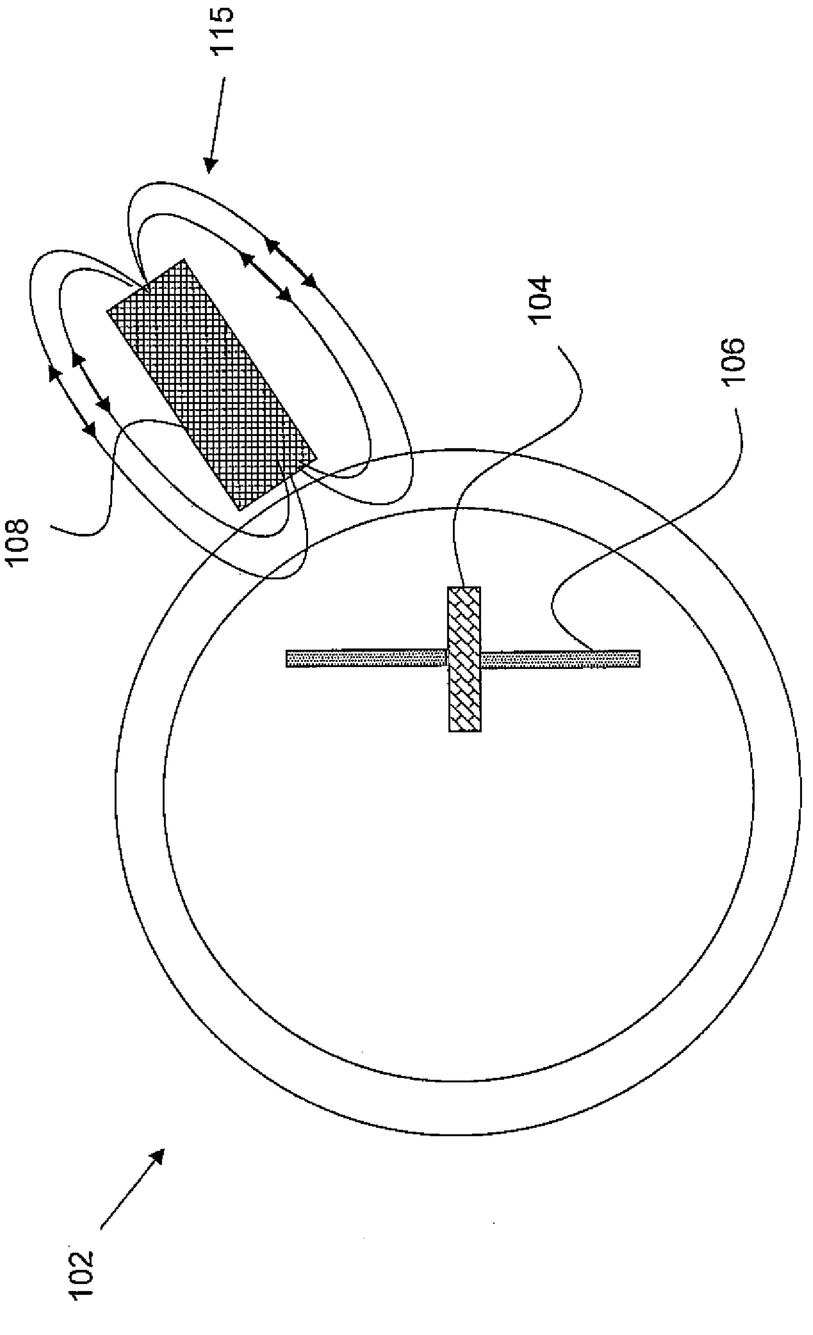
FIG. 4 PRIOR ART
FIG. 4 shows a simplified top view of a known electronic watt-hour meter.
Figure 5:
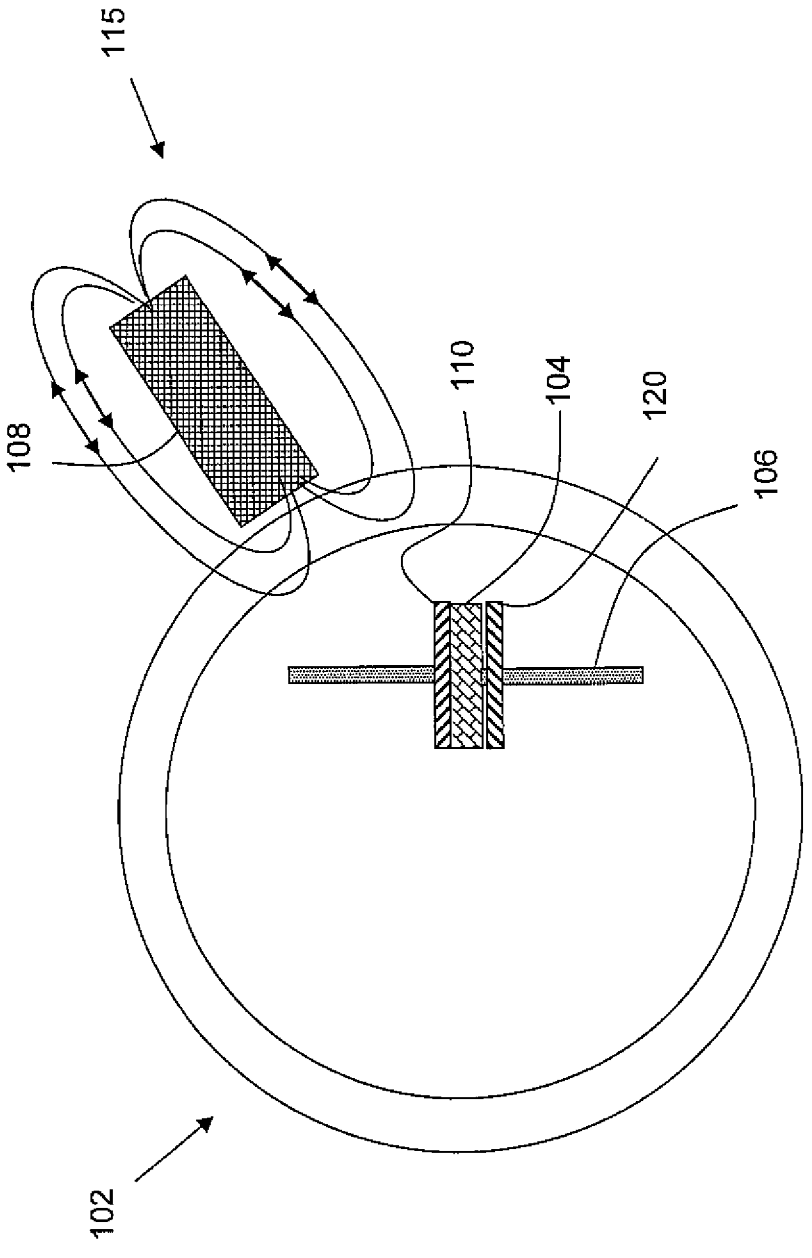
FIG. 5 shows a top view of one embodiment of an electronic watt-hour meter including a first shield and a second shield in accordance with the invention.

Referring to FIG. 5, a top view of one embodiment of electronic watt-hour meter including a first shield 110 and similarly structured second shield 120 in accordance with the invention is shown. First shield 110 is illustrated closer to external magnet 108 than second shield 120. First shield 110 or second shield 120 may be thicker than the other depending upon which of first shield 110 or second shield 120 is closest to anticipated location of external magnet 108. First shield 110 and/or second shield 120 may be placed on current transformer 104 during manufacture of current transformer 104 or electronic watt-hour meter or both. Alternatively, first shield 110 and/or second shield 120 may be placed on current transformer 104 subsequent to manufacture of electronic watt-hour meter. In one embodiment of the invention, current transformer 104 may be substantially torodial in shape and potential link 106 may be rod-like in shape. In one embodiment, first shield 110 or second shield 120 may substantially protect current transformer 104 from external magnet magnetic field 115 of approximately 5000 gauss or less when external magnet 108 is located, for example, approximately 1.27 centimeters (0.5 inches) or more away from current transformer 104.

Figure 6:
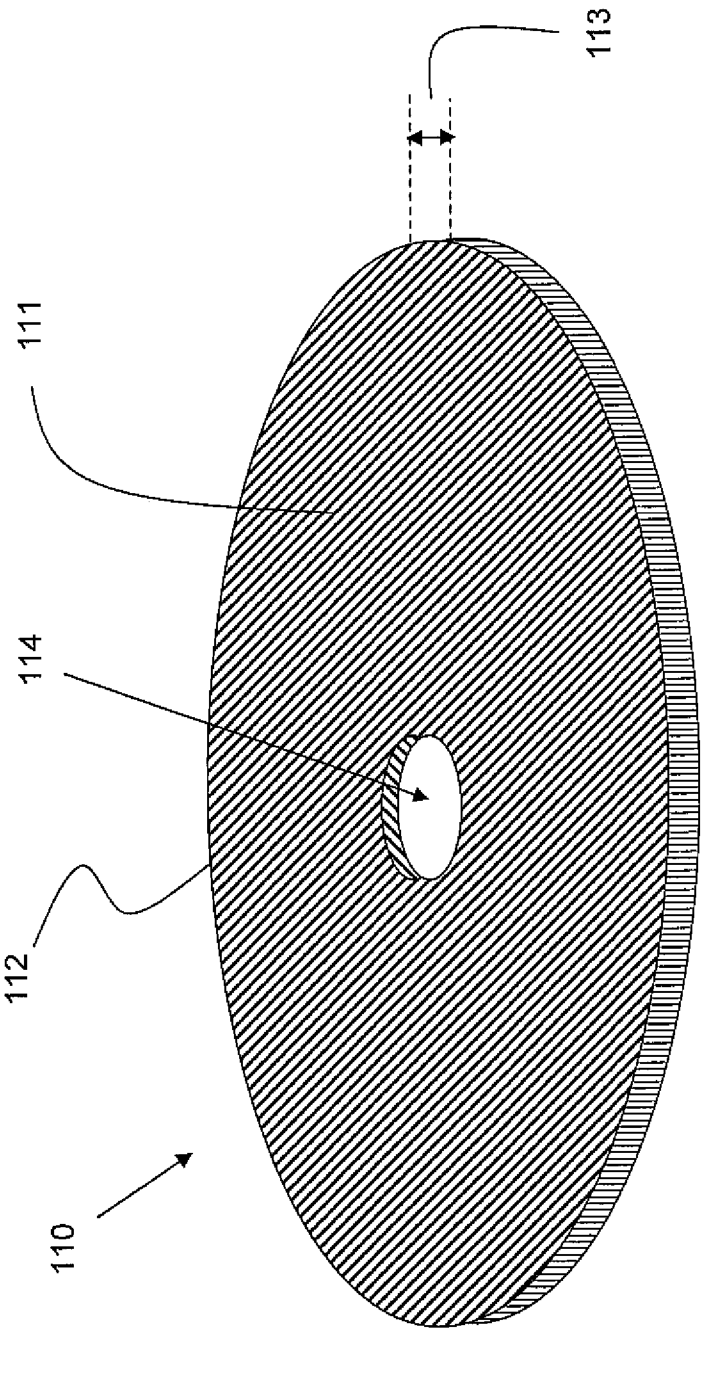
FIG. 6 shows a perspective view of one embodiment of a first shield in accordance with the invention.

Referring to FIG. 6, a perspective view of one embodiment of a first shield 110 in accordance with the invention is shown. First shield 110 may include a substantially disc shape body 111 having an edge 112. Current transformer 104 may be torodial in shape. Substantially disc shape body 111 may physically cover current transformer 104. First shield 110 may include other shapes, e.g. square, triangle, or other polygonal shapes. First shield 110 may include an aperture 114 which may extend through approximately a center of body 111. First shield 110 and second shield 120 may be placed on current transformer 104 by placing potential link 106 through aperture 114.

First shield 110 may include a substantially magnetically permeable and conductive metal. Magnetic permeability is the ability of a material to support the formation of a magnetic field within itself. It is the degree of magnetization that a material obtains in response to an applied magnetic field. Substantially magnetically permeable and conductive metal may include low carbon steel such as cold rolled steel and/or hot rolled steel. Low carbon steel may include a range of 0.05 percent to 0.26 percent carbon content such as American Iron and Steel Institute (AISI) 1005 to AISI 1026 steel. A thickness 113 of body 111 may range from, for example, approximately 0.15 centimeters to 0.64 centimeters (approximately 0.060 inches to 0.250 inches).

Figure 7:
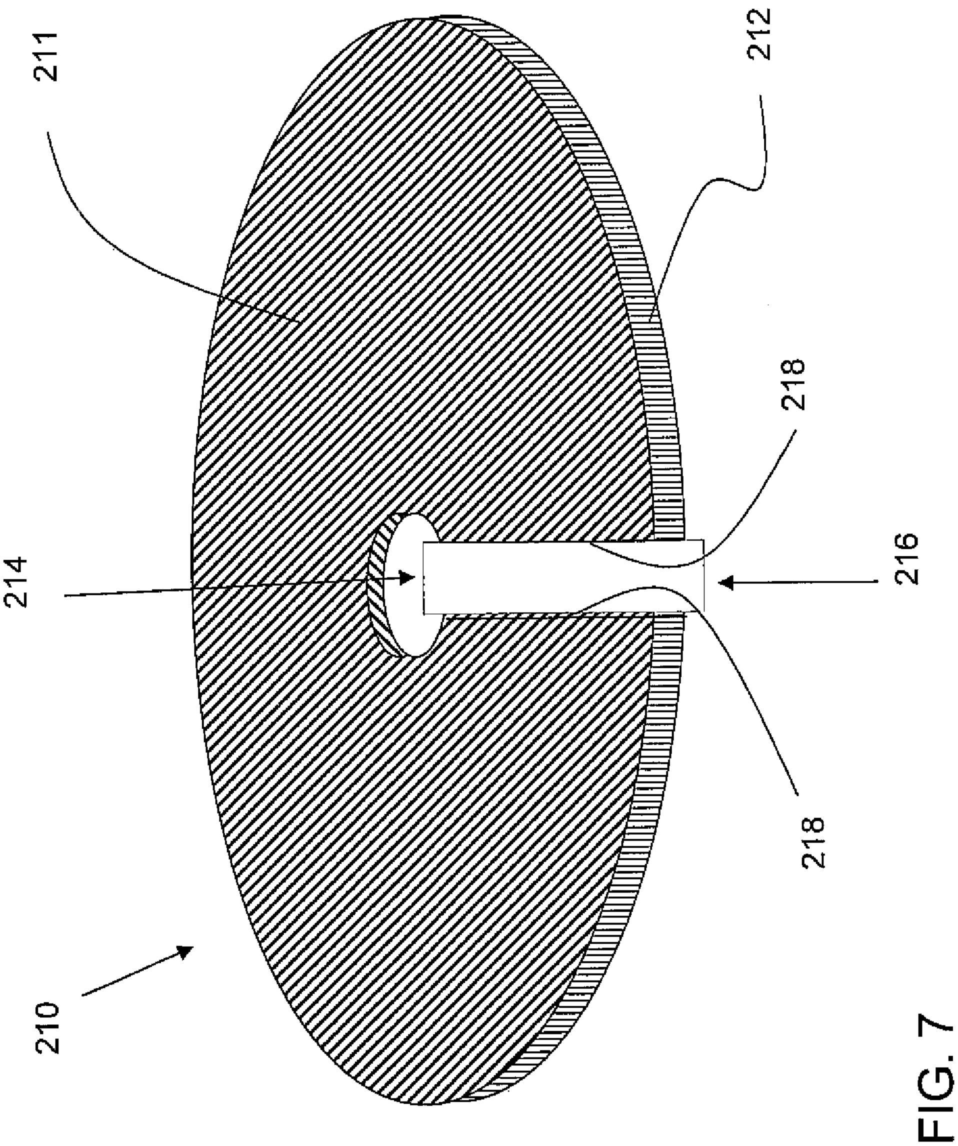
FIG. 7 shows a perspective view of one embodiment of a first shield in accordance with the invention.
Figure 8:
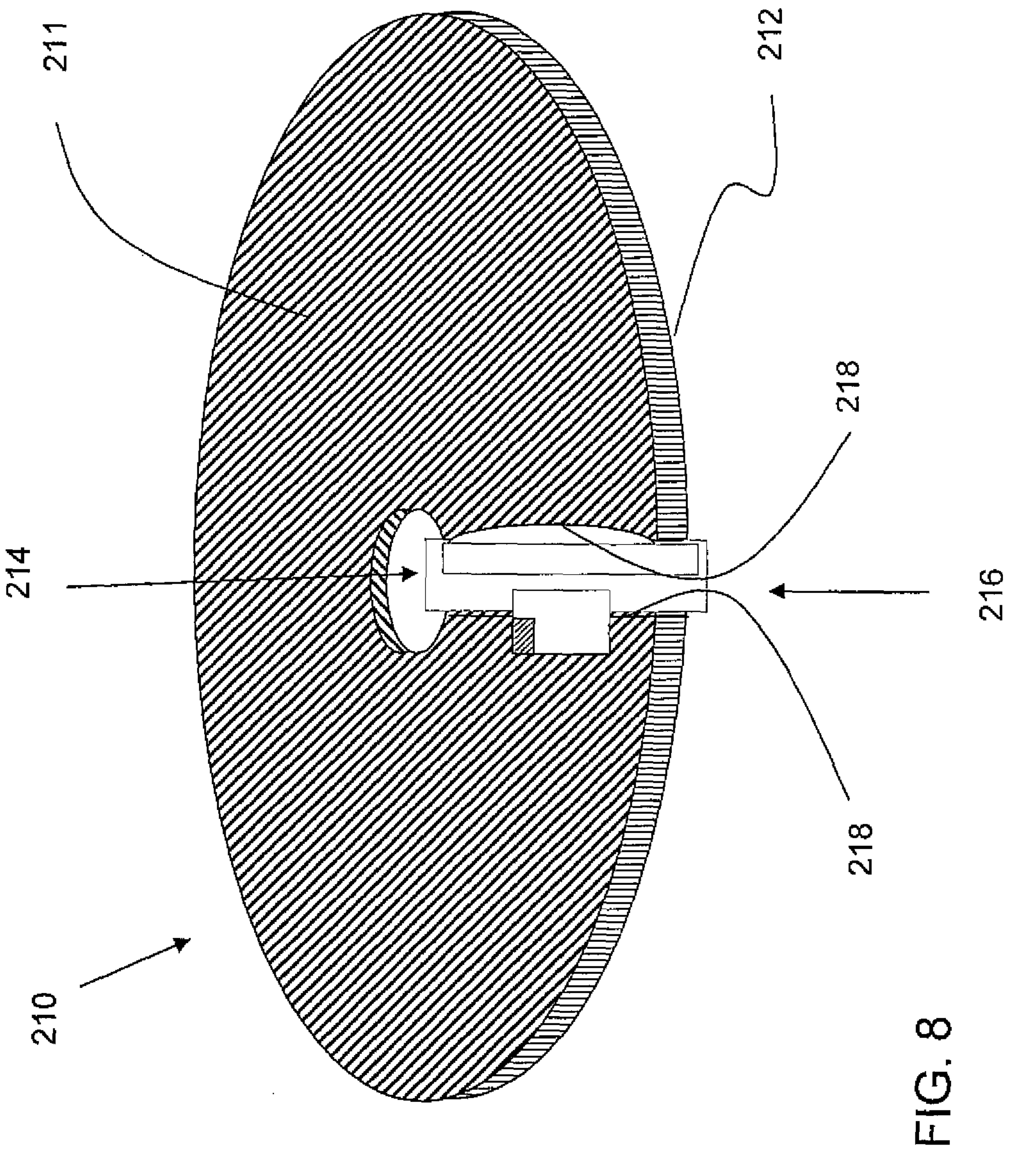
FIG. 8 shows a perspective view of one embodiment of a first shield in accordance with the invention.

Referring to FIG. 7, a perspective view of another embodiment of a first shield 210 in accordance with the invention is shown. First shield 210 may include a gap 216 extending from an edge 212 to aperture 214. Gap 216 may include two substantially parallel straight sides 218 extending from edge 212 to aperture 214 resulting in a generally linear gap 216. A current flowing through first shield 110 (without a gap) may produce energy losses in the form of heat and reduce the efficiency of electronic watt-hour meter 102. Gap 216 may interrupt the current flowing through the first shield 210 reducing energy losses. Referring to FIG. 8, first shield 210 may include irregularities in sides 218. For example, sides 218 may not be straight for the purpose of accommodating components in electronic watt-hour meter 102, e.g. they may include curving sides, notches, etc.

Figure 9:
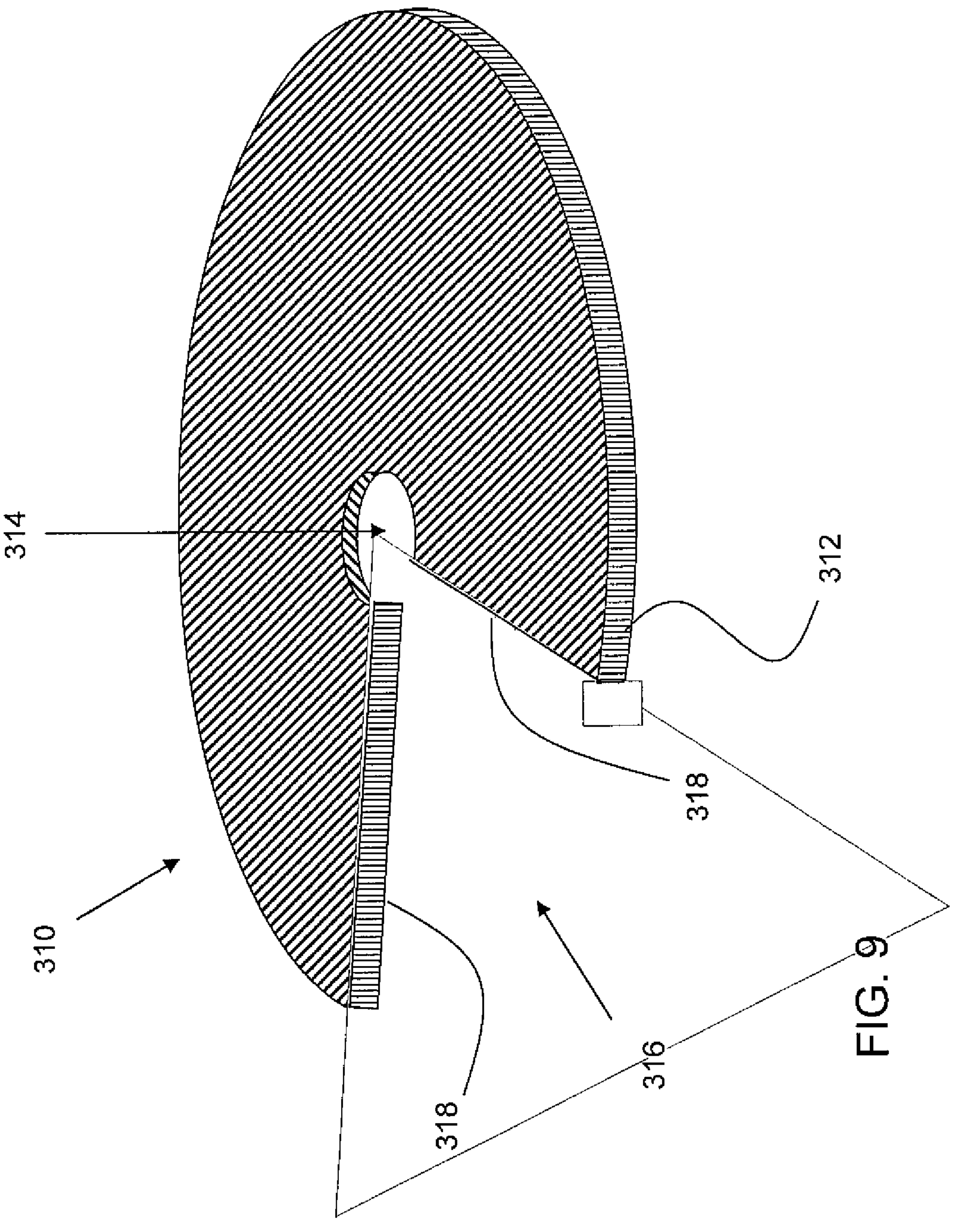
FIG. 9 shows a perspective view of one embodiment of a first shield in accordance with the invention.

Referring to FIG. 9, a perspective view of another embodiment of first shield 310 in accordance with the invention is shown. In this case, a gap 316 may include two non-parallel straight sides 318 extending from an edge 312 to an aperture 314 resulting in a substantially pie-shaped gap 316. Similarly to the embodiment shown in FIG. 8, sides 318 may not be straight.

Figure 10:
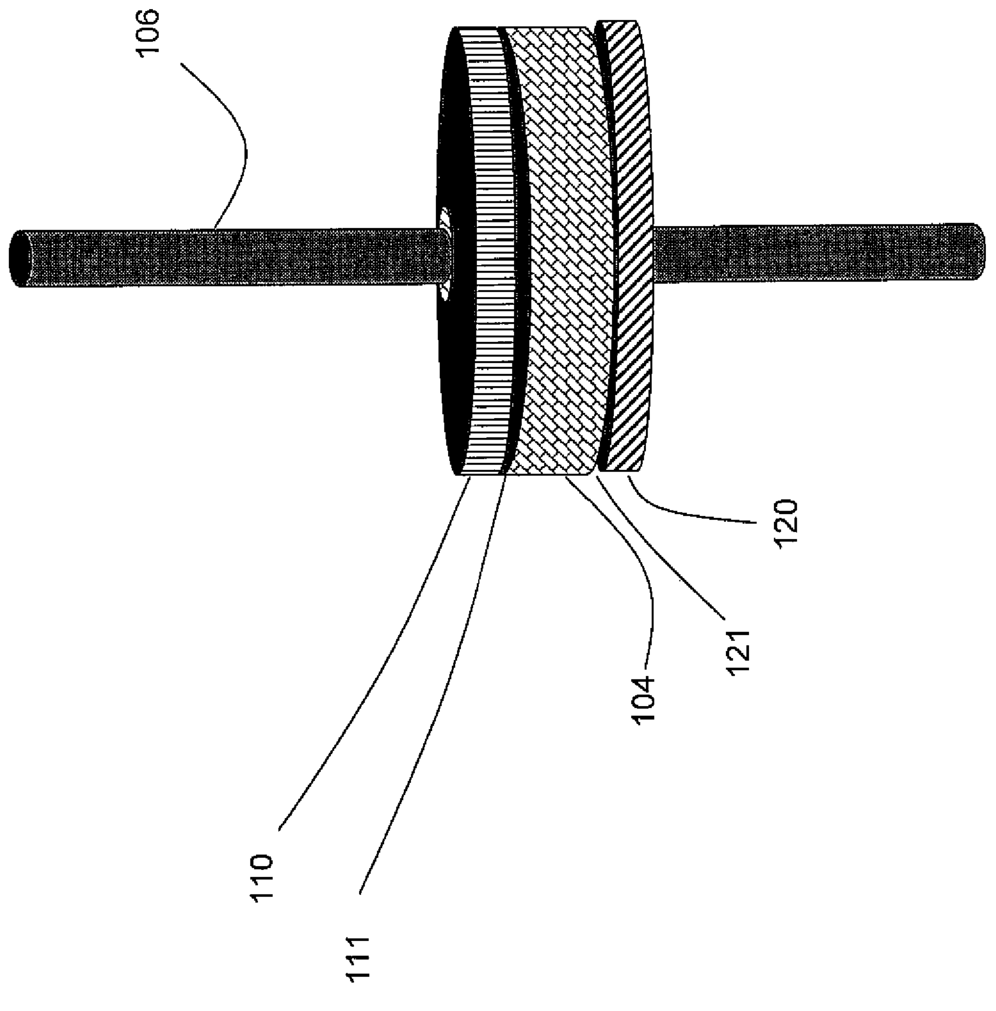
FIG. 10 shows a side view of one embodiment of a first shield and a second shield for a current transformer in accordance with the invention.

Referring to FIG. 10, a perspective view of one embodiment of a first shield 110, 210, 310 (only one reference number used hereafter for brevity) and a second shield 120, similarly structured to first shield 110, for current transformer 104 in accordance with the invention is shown. First shield 110 may be placed on a first side 111 of current transformer 104. Second shield 120 may be placed on a second side 121 of current transformer 104. Second side 121 may be substantially parallel to first side 111. Aperture 114 accommodates potential link 106 extending through current transformer 104. Aperture 114 is illustrated as substantially circular. A person skilled in the art will readily recognize that aperture 114 may be any shape that accommodates potential link 106. Gap 116 may be used to accommodate components within electronic watt-hour meter, e.g., metrology circuitry (not shown) and metrology circuitry bracket 109.

Gap 116, 216 (FIG. 7-9) in first shield 110 and/or second shield 120 may be oriented away from the anticipated location of external magnet 108. Alternatively, gap 116 may be sufficiently wide to slide first shield 110 (and second shield 120) over potential link 106.

Figure 11:
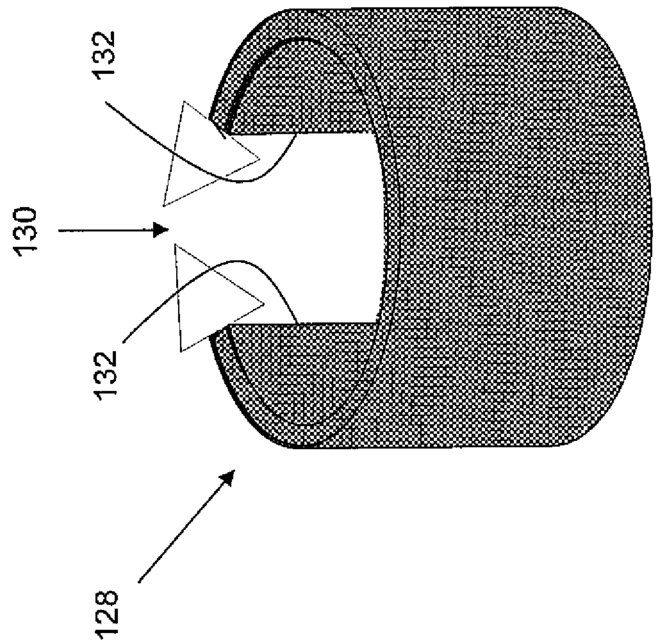
FIG. 11 shows a perspective view of one embodiment of a third shield in accordance with the invention.

Referring to FIG. 11, a perspective view of one embodiment of a third shield 128 in accordance with the invention is shown. Third shield 128 may include a substantially curvilinear planar shape. In one example shown, third shield 128 has a slotted tubular shape so as to be 'C' shaped in cross-section. Variants of this shape may be possible, e.g. closed tubular shape and half tubular shape. Two ends 132 of third shield 128 may create a third shield gap 130. Third shield 128 may include the same substantially magnetically permeable and conductive metal as first shield 110, and may feature the same thickness 113 and protection of current transformer 104 from magnetic field of external magnet 108 as described herein for first shield 110.

Figure 12:
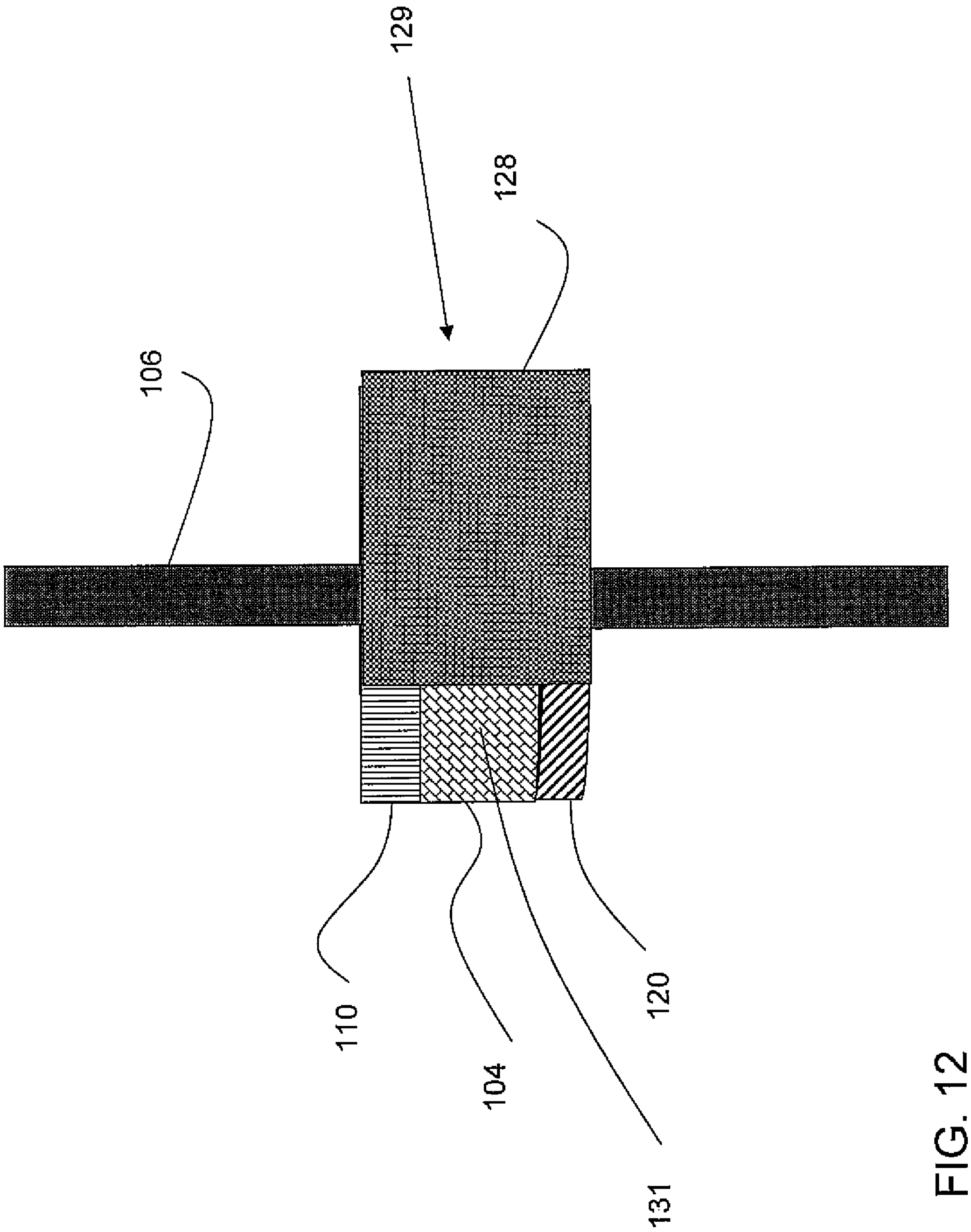
FIG. 12 shows a top view of one embodiment of a first shield, a second shield, and a third shield for a current transformer in accordance with the invention.

Referring to FIG. 12, a perspective view of one embodiment of first shield 110, second shield 120, and a third shield 128 for current transformer 104 in accordance with the invention is shown. Third shield 128 may be placed on a third side 129, e.g., an outer periphery, of current transformer 104. Third shield 128 may be connected with at least one of first shield 110 or second shield 120. Collectively, first shield 110, second shield 120, and third shield 128 may form a substantial enclosure of current transformer 104

Figure 13:
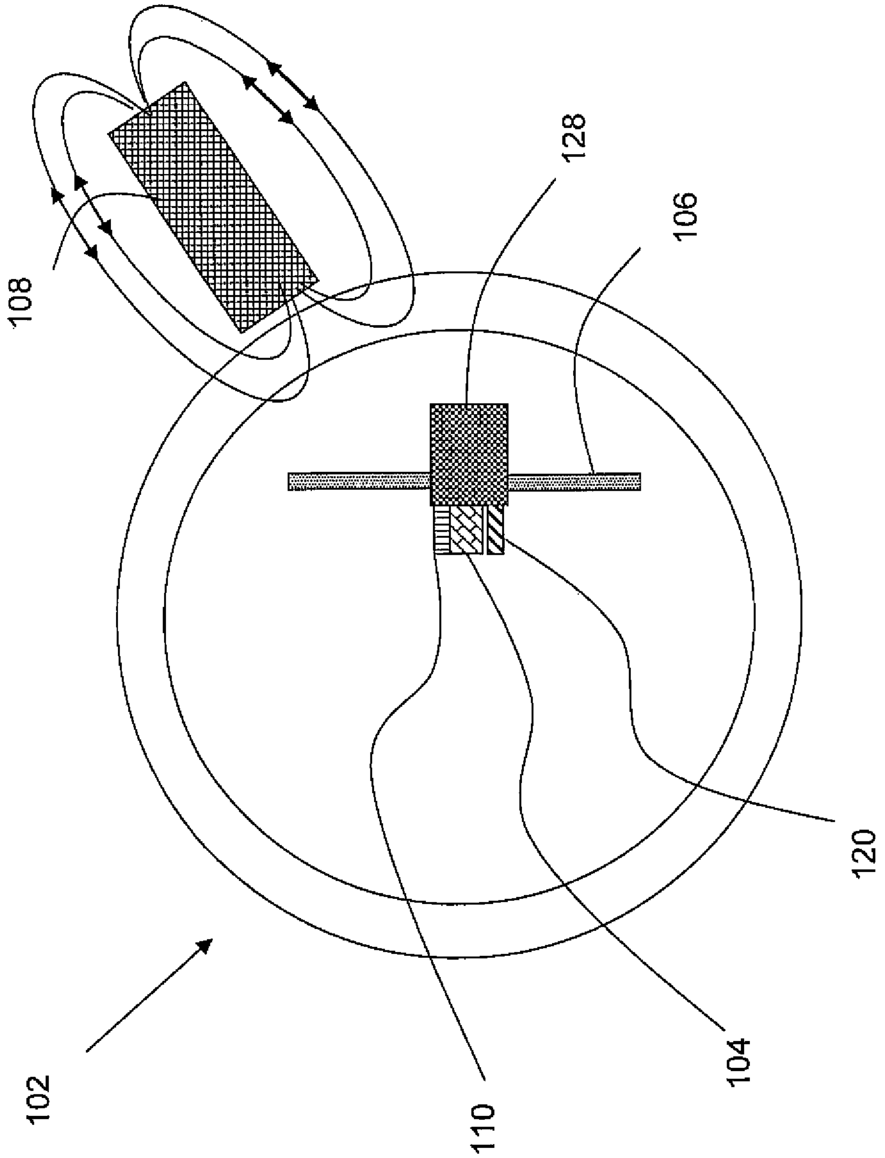
FIG. 13 shows a top view of one embodiment of electronic watt-hour meter including a first shield, a second shield, and a third shield for a current transformer in accordance with the invention.

Referring to FIG. 13, a perspective view of one embodiment of first shield 110, second shield 120, and third shield 128 in electronic watt-hour meter in accordance with the invention is shown. Third shield 128 may be located on current transformer 104 in substantial proximity to the anticipated location of external magnet 108.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. An electronic watt-hour meter, comprising:

a current transformer operatively coupled to the electronic watt-hour meter;

a first shield on a first side of the current transformer; and a second shield on a second side of the current transformer, wherein the second side is substantially parallel to the first side, wherein the first shield and the second shield each include a substantially disc shaped body; an aperture through approximately a center of the body; and a gap in the body, the gap extending from an edge of the body to the aperture and a substantially magnetically permeable and conductive metal, and wherein the aperture accommodates a potential link through the current transformer.

2. The electronic watt-hour meter of claim 1, wherein the substantially magnetically permeable and conductive metal includes a low carbon steel.

3. The electronic watt-hour meter of claim 2, wherein the low carbon steel includes less than approximately 0.26 percent carbon content.

4. The electronic watt-hour meter of claim 1, wherein the current transformer is substantially torodial in shape.

5. The electronic watt-hour meter of claim 1, wherein one of the first shield and the second shield is thicker than the other of the first shield and the second shield.

6. The electronic watt-hour meter of claim 1, wherein at least one of the first shield and the second shield substantially shields up to approximately 5000 gauss from an external magnet.

7. An electronic watt-hour meter, comprising:

a current transformer operatively coupled to the electronic watt-hour meter;

a first shield on a first side of the current transformer;

a second shield on a second side of the current transformer, wherein the second side is substantially parallel to the first side;

wherein at least one of the first shield and the second shield substantially shields up to approximately 5000 gauss from an external magnet and wherein the first shield and the second shield each include a substantially disc shaped body; an aperture through approximately a center of the body; and a gap in the body, the gap extending from an edge of the body to the aperture and a substantially magnetically permeable and conductive metal, and wherein the aperture accommodates a potential link through the current transformer.

* * * * *